United States Patent

[11] 3,571,723

[72] Inventor Hironobu Ogusu
Tokyo, Japan

[21] Appl. No. 798,626
[22] Filed Feb. 12, 1969
[45] Patented Mar. 23, 1971
[73] Assignee Alps Electric Company, Limited
Tokyo, Japan

[54] UHF-VHF TUNER HAVING MEANS FOR REDUCING STRAY COUPLING BETWEEN A FILTER AND THE VHF TUNER DURING UHF BAND RECEPTION
14 Claims, 5 Drawing Figs.

[52] U.S. Cl. .......... 325/461, 325/379, 334/1
[51] Int. Cl. .......... H03d 7/16, H04b 1/26
[50] Field of Search .......... 325/458—461, 477, 366, 368, 369, 377, 379, 388, 315—317; 334/1, 2; 333/7

[56] References Cited

UNITED STATES PATENTS

| | | | |
|---|---|---|---|
| 2,964,623 | 12/1960 | Bell | 325/458 |
| 3,469,194 | 9/1969 | Osborn | 325/373X |

OTHER REFERENCES

Allied Radio Catalog for 1968 #680: page 214 Description of Centralab PA-11,18,40 and 41 switch sections.

*Primary Examiner*—Robert L. Griffin
*Assistant Examiner*—Benedict V. Safourek
*Attorney*—James and Franklin

ABSTRACT: A communications receiver having the capability of receiving signals in the UHF and VHF bands comprises a UHF tuner, a VHF tuner and a filter connected between the VHF antenna port and the VHF tuner during VHF reception. For UHF reception the UHF tuner is operatively connected to the input of the VHF tuner and the output of the filter is disconnected therefrom. A switch is provided to do one or more of the following during UHF reception: (a) disconnect the input of the filter from the VHF antenna port; (b) connect the filter input to ground; and (c) connect the output of the filter to ground, all to reduce the stray coupling of spurious signals from the VHF antenna to the VHF tuner during UHF reception.

INVENTOR
HIRONOBU OGUSU
BY James and Franklin
ATTORNEY

INVENTOR
HIRONOBU OGUSU
BY James and Franklin
ATTORNEY

UHF-VHF TUNER HAVING MEANS FOR REDUCING STRAY COUPLING BETWEEN A FILTER AND THE VHF TUNER DURING UHF BAND RECEPTION

The present invention relates to communication receivers, and particularly to a receiver capable of operating or receiving signals within two discrete frequency bands, such as, but not limited to, the UHF and VHF bands.

It is known to provide communication receivers for receiving signals within two discrete frequency bands. One of the more common receivers of this type is the commercial television receiver which has tuning circuits capable of selectively operating the receiver to tune within stations or channels within the UHF and the VHF bands. In a typical such TV receiver, separate antenna terminals are provided for the UHF and VHF bands. The input of the UHF tuner is connected to the UHF antenna terminal and that tuner is effective to produce an intermediate frequency signal which is applied, during UHF reception, to the VHF tuner which, during UHF operation, is disconnected from the VHF antenna and acts as an I.F. amplifier to amplify that intermediate frequency. In VHF reception the output of the UHF tuner is disconnected from the input of the VHF tuner and the VHF turner is connected to the VHF antenna and is returned to its condition for receiving and mixing R.F. signals in the VHF band.

It is common practice to provide a band-reject filter between the VHF antenna terminal and the input of the VHF tuner to reject, during VHF operation, interference signals received at the VHF antenna terminal in the intermediate frequency range. These signals may be picked up at the VHF antenna from neighboring receivers, police transmitters in the area, or from internal stray coupling of those signals. The filter substantially prevents these interference signals from entering the VHF tuner during VHF reception so that undesired, spurious signals in the video and/or audio outputs of the receiver during VHF reception are avoided.

During reception in the UHF band the output of the filter and the VHF antenna are disconnected from the input of the VHF tuner. It has, however, been found that even when the filter output is disconnected from the input of the VHF tuner during UHF reception, a substantial amount of these spurious intermediate frequency signals are coupled to the input of the VHF tuner, as by stray radiation coupling from the filter and the VHF antenna. These spurious signals will be acted upon in the VHF tuner (which, it will be recalled, is an equivalent I.F. strip at this time) along with the intermediate frequency output signal from the UHF tuner so as to produce interference intermediate frequency signals, which in turn produce unwanted spurious output video and/or audio signals during UHF reception. This is, of course, undesirable.

Stray coupling of these spurious I.F. signals to the VHF tuner during VHF reception does not create problems of this nature as the input stage of that tuner at that time is a tuned R.F. stage, which effectively rejects signals lying outside its tuned band.

It is an object of the present invention to provide in a communication receiver having the capability of selectively receiving signals lying within one of two discrete frequency bands and having a filter to reject unwanted signals during reception in one of these bands, means to substantially reduce unwanted stray coupling from the filter to the tuner of the receiver when the filter performs no useful purpose, as during operation of the receiver in the other of the bands.

It is a further object of the present invention to provide a receiver of the type described in which, when the receiver is operating in one of its frequency bands, both the inputs and outputs of the filter are respectively disconnected from the antenna terminal and from the tuner input.

It is yet a further object of the present invention to provide in a UHF-VHF tuner, means for improving the isolation between the VHF antenna and the VHF tuner during UHF reception.

It is another object of the present invention to provide a dual band communication reciever in which interference signals within a specified range are substantially eliminated during operation of the receiver in both of its operative frequency bands, thereby to improve the quality of the video and/or audio outputs of the receiver.

To these ends the present invention provides a tuner for use in a communications receiver such as a TV receiver which is capable of being selectively tuned to frequencies in either of two frequency bands. That receiver comprises a first tuner for operation in the first of the frequency bands and a second tuner for operation in the second frequency band. Frequency suppressing means in the form of a filter or a frequency trap is connected between one antenna port and the input to the second tuner, and switch means are provided to connect the output of the first tuner to the input of the second tuner, to disconnect the output of the filter from the input of the second tuner, and to disconnect the input of the filter from said one antenna port during operation in the first frequency band. The switch means may comprise first and second switches respectively interposed between the antenna port and the filter, and between the output of the filter and the first tuner and the input of the second tuner. The switch means, as in two of the embodiments of the invention particularly described herein, may be effective to connect either or both of the input and output of the filter to ground when the tuner is operating in the first frequency band. As a result of these operations, singly and in combination, stray coupling of spurious signals between the filter and the second tuner during operation of the receiver in that band is substantially reduced, thereby reducing the effect of spurious interference signals on the output of the receiver.

The present invention is described with particular reference to a receiver for selectively receiving signals within the UHF and VHF bands corresponding respectively to the first and second frequency bands described above. The first or UHF tuner comprises means for deriving a UHF intermediate frequency and external signals at that intermediate frequency are suppressed by the filter during operation of the receiver in the VHF band.

To the accomplishment of the above, and to such other objects as may hereinafter appear, the present invention relates to a communications receiver as defined in the appended claims and as described in this specification, taken together with the accompanying drawings, in which:

Figure 4:
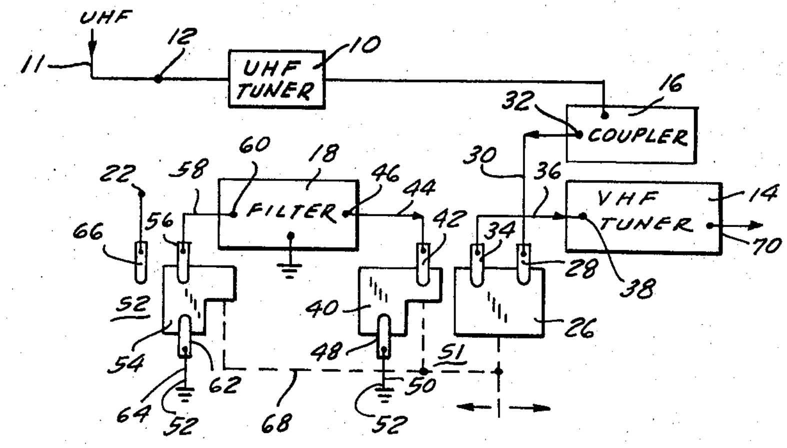
FIG. 4 is a schematic diagram, partially in block form, of a UHF-VHF receiver embodying the features of the present invention.

FIGS. *5a* and *5b* schematically illustrate two typical prior art receivers in block diagram form; and FIGS. *5c*—*5f* schematically illustrate in block diagram form various configurations of the receiver of the present invention, FIG. *5f* corresponding to the configuration shown in FIG. 4.

The present invention relates to a communications receiver for selectively receiving signals within two discrete frequency bands, and as herein specifically disclosed, for receiving signals lying within the UHF and VHF frequency bands. Typical prior art tuners of this type are shown in block diagram form in FIGS. *5a* and *5b*, the blocks representing conventional receiving and tuning circuitry the design and operation of which are known to those skilled in the communications receiver art, and which are therefore only schematically shown and described in this specification.

That reciever comprises a first or UHF tuner 10 having an input operatively connected to a UHF antenna 11 at terminal 12, a second or VHF tuner 14 comprising an input amplifier represented schematically by transistor TR1 (FIG. 3), and an impedance matching coupling circuit generally designated 16 connected to the output of the UHF tuner 10 and, through a contact of a switch S1, to the input of the VHF tuner 14 during operation of the receiver in the UHF band. A frequency suppressing means in the form of a filter 18 has its input connected to a VHF antenna terminal 22 and its output connected during VHF reception through a contact of switch S1, to the input of the VHF tuner 14. Thus, during VHF operation, switch S1 is effective to connect the filter 18 to the input of the VHF tuner 14 and to disconnect the output of coupling circuit 16 therefrom. Conversely, during operation of the tuner in the UHF band, the movable contact of switch S1 is moved to connect the coupling circuit 16 to the input of the VHF tuner 14 and to disconnect the output of the filter 18 therefrom.

The filter 18 is designed to suppress or reject frequencies within the I.F. band, which for Japanese broadcasting practice is that band between 54.25 and 58.75 mc. (In U.S. practice the corresponding I.F. signals are at 41.25 mc and 45.75 mc). During VHF operation the VHF tuner acts to heterodyne the VHF signal received at antenna terminal 22 to produce an I.F. signal. The output of filter 18 is connected to the input of the VHF tuner 14. Interferencce signals in the intermediate frequency range, which may be present at the VHF antenna, are cut off from the input of the VHF tuner 14 by the filter 18, so that spurious signals resulting from these unwanted interference signals are not developed in the video and/or audio receiver outputs.

During UHF reception, the UHF tuner produces an intermediate frequency signal which is applied through the coupling circuit 16 to the input of the VHF tuner 14, the latter being modified during UHF operation to act only as an intermediate frequency amplifier.

Figure 5:
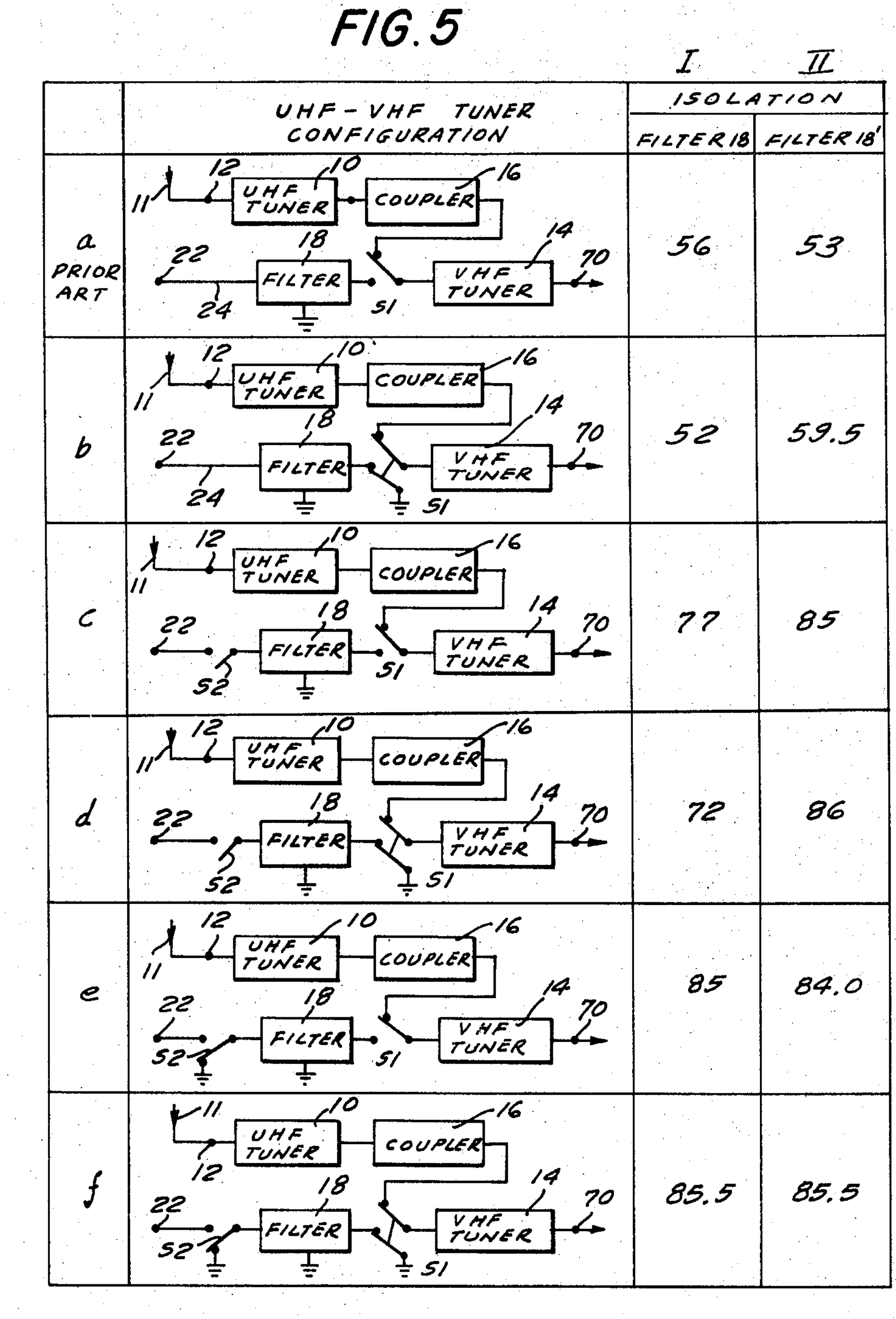

As described above, during reception in the UHF band the output of filter 18 is disconnected from the input of the VHF tuner 14 by the operation of switch S1 and the output of coupling circuit 16 is connected to the input of the VHF tuner 14. At this time, according to the teachings of the prior art, the output of the filter 18 is either merely disconnected, as shown in FIG. 5*a*, or also connected to ground as shown in FIG. 5*b*. It has been found that with this prior art procedure of disconnecting only the output of filter 18 from the VHF tuner 14 during UHF reception, there is still a substantial amount of stray coupling of interference signals, including signals in the intermediate frequency range, from the VHF antenna and conductor 24 to the input of the VHF tuner 14. This is believed to be partly a result of the fact that the length of the conductor 24 between the antenna terminal 22 and the input terminal of the filter 18 is considerable and tends to pick up stray intermediate signals which are fed to filter 18 and fed from there by stray coupling to the input of the VHF tuner 14 even when the output terminal of filter 18 is disconnected from the VHF tuner 14. These spurious signals in the I.F. band are amplified in VHF tuner 14 along with the signal intermediate frequency signals from the UHF tuner 10, thereby to generate the unwanted spurious signals in the video and/or audio outputs of the receiver.

In accord with the present invention as illustrated in FIG. 4 and FIGS. 5*c*—5*f*, a second switch means generally designated S2 is provided between the antenna port 22 and the input of the filter 18 which is effective when the receiver is operating in the UHF mode to disconnect the input of filter 18 from the VHF antenna port 22 and conductor 24. In VHF operation, switch S2 is actuated along with switch S1 to connect the input of the filter 18 to the VHF antenna terminal 22 as appropriate for VHF operation. It has been found that by disconnecting the input of filter 18 from the antenna terminal 22 in addition to the conventional disconnection of the output of the filter from the input terminal of the VHF tuner 14 during UHF reception, there is a marked reduction in the stray coupling of the spurious intermediate frequency signals to the VHF tuner 14.

FIG. 4 illustrates a receiver embodying this feature of the present invention and FIGS. 5*c*—5*f* illustrate four possible switching connections for switch S2 and the conventional switch S1. Switch S1 comprises a slidable conducting plate 26, a contact 28 connected by a lead 30 to the output terminal 32 of coupling circuit 16, and a contact 34 which is connected by a lead 36 to the input terminal 38 of the VHF terminal 14. Switch S1 further comprises a second movable conducting plate 40, a contact 42 which is connected by a lead 44 to the output port 46 of filter 18, and a second contact 48 which is connected by a lead 50 to ground at 52. Switch S2 comprises a movable conducting plate 54, a contact 56 which is connected by a lead 58 to the input port 60 of filter 18, a second contact 62 connected by a lead 64 to ground, and a third contact 66 connected to VHF antenna terminal 22. Switches S1 and S2 are preferably mechanically operatively ganged or linked by means of a mechanical interlock coupling generally designated 68 so that the operation of one of the switchs, e.g. S1, is automatically effective to move the other switch, e.g. S2, to its desired position for either UHF or VHF operations as desired. FIG. 4 illustrates the position of switches S1 an S2 for receiver operation in the UHF band, and corresponds to the schematic block diagram of FIG. 5*f*. Plate 26 bridges and thus electrically connects contacts 28 and 34, and plate 40 is effective to engage and electrically connect contacts 42 and 48. Contacts 42 and 34 are not connected to one another. Thus, as desired, the output terminal 32 of coupling circuit 16 is connected via contact 28, plate 26 and contact 34 to the input terminal 38 of VHF receiver 14. Similarly the output terminal 46 of filter 18 is connected via contact 42, plate 40 and contact 58 to ground, and is disconnected from the VHF tuner input. Moreover, the input terminal 60 of filter 18 is connected to ground via contact 56, plate 54 and contact 62, and is disconnected from contact 66 and thus from antenna terminal 22.

In the operation of the receiver in the VHF band plates 26 and 40 are moved in unison towards the left as viewed in FIG. 4, so that plate 26 bridges and makes electrical contact between contacts 34 and 42, and electrically disconnects contacts 34 and 28. As the same time the movement towards the left of plate 40 breaks the contact between the contacts 42 and 48, and the leftward movement of plate 54 breaks the contact between contacts 56 and 62 and effects electrical contact between contacts 56 and 66. Thus for VHF operation antenna port 22 is connected to contact 56 and thus to output port 60 of the filter 18, that input port being removed from ground by the breaking of the connection between contacts 56 and 62. At the same time the output terminal 46 of filter 18 is connected to contact 34 and thus to the input terminal 38 of the VHF terminal 14.

While in the circuit of FIGS. 4 and 5*f*, both the input and output terminals of the filter 18 are connected to ground during UHF operation by the respective operation of switches S2 and S1, one or both of these terminals may be merely respectively disconnected from the antenna terminal 22 and the input of the VHF tuner rather than being grounded (see FIGS. 5*c*—*e*). Thus in the circuit of FIG. 5*c*, both the input and output ports of the filter are merely disconnected from their previously contacted points, i.e. the antenna terminal and input of to the VHF tuner, during UHF operation. In FIG. 5*d* the input port of the filter is disconnected from the antenna port and the output port is connected to ground. The circuit of FIG. 5*e* is the reverse of that of FIG. 5*d* in that during UHF operation, the input to the filter is grounded while the output of the filter is merely disconnected from the input to the VHF tuner.

Figure 1:
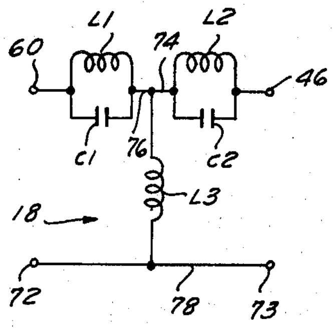
FIG. 1 is a circuit diagram of one type of filter which may be used in the receiver of the present invention.
Figure 2:
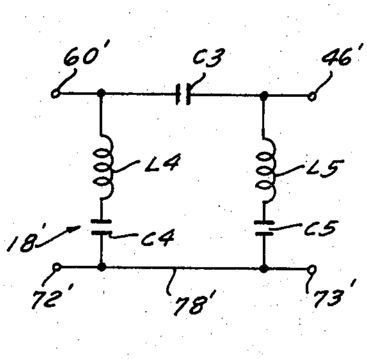
FIG. 2 is another type of filter which may be used in the receiver of the present invention.

The improved results derived by disconnecting the input of the filter from the VHF antenna terminal in addition to the conventional disconnection of the filter output from the VHF tuner during UHF operation are shown in the columns provided at the right of the circuit diagrams of FIGS. 5*a*—*f*. Column I represents the results in which the filter of FIG. 1 is used as the filter 18, and column II represents the results derived for a circuit in which the filter of FIG. 2 is utilized as the filter 18′. The numbers in the columns indicates the db of attenuation for signals in the intermediate frequency band applied to VHF antenna terminal 22 as compared to he the signal level at the output 70 of the VHF tuner as a result of stray coupling when the switches S1 and S2 are arranged in a position for UHF reception. Thus it will be seen that in the prior art circuit of FIG. 5*a* the respective attenuations derived for the spurious I.F. signals during UHF operation are only 56 db and 53 db depending upon the type of filter used in that circuit, and in the circuit of FIG. 5*b* the attenuations of these signals are respectively 52 db and 59.5 db for these filters. For the circuits of the present invention as shown in FIGS. 5*c*—5*f*, the resulting attenuations of the spurious intermediate frequency signals vary from 72 db for the circuit of FIG. 5*d* utilizing the filter of FIG. 1, to a maximum of 86 db when the filter of FIG. 2 is used in that circuit. Thus, an increase in attenuation of as much as 34 db of these spurious intermediate frequency signals is achieved by the disconnection of the input of the filter from the antenna terminal during UHF reception in accord with the present invention.

Typical designs of filters 18 and 18′ are shown respectively in FIGS. 1 and 2, FIG. 1 illustrating a T-filter comprising an input port 60, an output port 46 and a grounded input and output ports 72 and 73. A pair of filter sections comprising respectively an inductor L1 in shunt connection with capacitor C1 and an inductor L2 in shunt connection with a capacitor C2 are provided in the upper line 47 of the filter between input port 60 and output port 46, and an inductor L3 is connected between a junction point 76 between the filter sections and a ground line 78 connected between ports 72 and 73. For effective rejection of the signals lying in the band between 54.25 mc. and 58.75 mc. as desired in Japanese practice, the values of the components of the filter of FIG. 1 are as follows: L1 = 0.19 microhenry, C1 = 43.3 pf, the tuning frequency determined by inductor L1 and capacitor C1 being 54.25 megacycles; and inductor L2 = 0.143 microhenry, and capacitor C2 = 9.2 pf, the tuning frequency determined by the section comprising inductor L2 and capacitor C2 being 58.75 megacycles. Inductor L3 was .135 microhenry to provide a filter having an input and output impedance of approximately 75 dms and in which the attenuation of the central frequency of approximately 56.5 mc. megacycles was approximately 35 db. The filter 18′ of FIG. 2, which provides a corresponding frequency response, is a $\pi$-type filter having an input port 60′ an output port 46′ and grounded ports 72′ and 73′. A capacitor C3 is connected between input port 60′ and output port 46′ and a series circuit comprising conductor L4 and capacitor C4 is connected between the input port 60′ and the ground line 78′, and a series circuit comprising inductor L5 and capacitor C5 is connected between output port 46′ and ground line 78′. The values of the components of the filter of FIG. 2 for desired band rejection are: C4 = 30 pf, L4 = 0.316 microhenry; the series tuning frequency determined by capacitor C4 and inductor L4 being 54.25 mc. capacitor C5 = 20 pf and inductor L5 = 0.39 microhenry; the series tuning frequency determined by the latter being 58.75 megacycles. Capacitor C3 was 29 pf and again the input and output impedances of filter 18′ were approximately 75 ohms and an attenuation of approximately 35 db was obtained at the central frequency of the filter. The component values given above may be modified to adapt the filter operating specifications to U.S. practice in a known manner.

The differences in the attenuation when the two different types of filter are employed can be ascribed to the fact that by grounding the output port 46 of the T-filter 18 of FIG. 1, the L2—C2 filter section is not short circuited, but by connecting the output terminal 46′ of filter 18′ of FIG. 2 to the grounded output terminal 73′ the series L5—C5 tuning circuit is short circuited.

Figure 3:
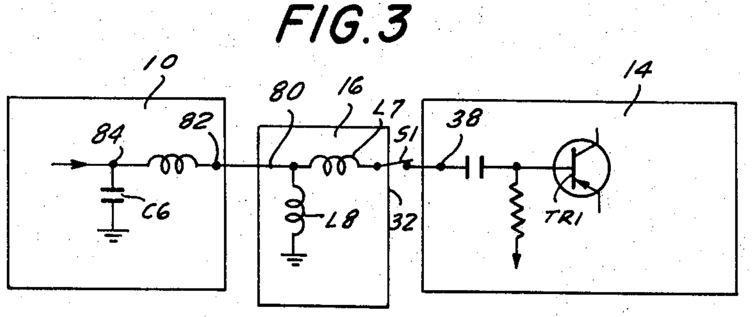
FIG. 3 is a schematic diagram in block form illustrating the manner in which the UHF tuner is connected to the input of the VHF tuner during receiver operation in the UHF band.

The coupling circuit 16 as shown in FIG. 3 comprises an input port 80 connected to the output terminal 82 of the UHF tuner 10. A series inductance L7 is connected between terminals 32 and 80, and an inductor L8 is connected between terminal 80 and ground. The output circuit of UHF tuner 10 comprises an inductor L9 connected to terminal 82 and a bypass capacitor C6 connected between a point 84 and ground.

The receiver of the present invention thus provides a substantially greater reduction of the stray coupling of interference signals in the intermediate frequency range to the input of the VHF tuner during UHF operation. This reduction, which is effective to substantially reduce the presence of spurious interference signals at the video and/or audio outputs of the receiver, is effected by means of an additional switch which is incorporated into the receiver circuit to disconnect the input of a band-reject filter conventionally provided in receivers of this type between the VHF antenna terminal and the input of the VHF tuner. The additional switch may be operated along with a switch conventionally provided for disconnecting the output of the filter from the VHF tuner during UHF operation. The improved isolation between the VHF antenna and VHF tuner during UHF operation is obtained irrespective of the type of band reject filter which may be employed and is achieved by a reliable and inexpensive addition to the already known UHF-VHF receiver circuitry. Operation within the VHF band is substantially unaffected by the addition of the additional switch means between the VHF antenna and the filter input and is highly effective when the receiver is operating in the UHF band to achieve the improved results described above with respect to the reduction of stray coupling between the VHF antenna, the filter and the input of the VHF tuner.

While several embodiments of this invention have been herein specifically disclosed, it will be apparent that variations may be made thereto without departing from the spirit and scope of the invention as defined in the following claims:

I claim:

1. In a communication receiver having the capability of being selectively tuned to frequencies in either a first or second frequency band, said receiver comprising, a first tuner for said first frequency band, a second tuner for said second frequency band, an antenna port, frequency suppressing means having an input operatively connected to said antenna port and an output, and first switch means effective in a first position to operatively connect the output of said first tuner to and to disconnect the output of said frequency suppressing means from the input of said second tuner for operation of the receiver in said first frequency band and effective in a second position to operatively connect the output of said frequency suppressing means to and to disconnect the output of said first tuner from the input of said second tuner for operation of the receiver in said second frequency band; the improvement which comprises, second switch means interposed between said antenna port and said input of said frequency suppressing means, and means for actuating said second switch means, said means being adapted to be actuated when said first switch is in said first position, said second switch means being effective when actuated to operatively disconnect the input of said frequency suppressing means from said antenna port, thereby to reduce the stray coupling from said suppressing means to the input of said second tuner during operation in said first frequency band.

2. The receiver of claim 1, in which said second switch means comprises means for operatively connecting the input of the frequency suppressing means to a point of reference potential.

3. In the receiver of claim 2, interlock means operatively connected between said first and second switch means effective to actuate said second switch means in response to the placing of said first switch means to its said first position.

4. The receiver of claim 3, in which said first switch means in its said first position is effective to operatively connect the output of said frequency suppressing means to a point of reference potential.

5. The receiver of clam claim 4, in which said first frequency band is the UHF band, and said second frequency band is the VHF band, said first tuner comprising means for developing an intermediate frequency, said frequency suppressing means comprising means for attenuating said intermediate frequency.

6. The receiver of claim 2, in which said first switch means in its said first position is effective to operatively connect the output of said frequency suppressing means to a point of reference potential.

7. The receiver of claim 6, in which said first frequency band is the UHF band, and said second frequency band is the VHF band, said first tuner comprising means for developing an intermediate frequency, said frequency suppressing means comprising means for attenuating said intermediate frequency.

8. The receiver of claim 2, in which said first frequency band is the UHF band, and said second frequency band is the VHF band, said first tuner comprising means for developing an intermediate frequency, said frequency suppressing means comprising means for attenuating said intermediate frequency.

9. In the reciever of claim 1, interlock means operatively connected between said first and second switch means effective to actuate said second switch means in response to the placing of said first switch means to its said first position.

10. The receiver of claim 9, in which said first switch means in its said first position is effective to operatively connect the output of said frequency suppressing means to a point of reference potential.

11. The receiver of claim 10, in which said first frequency band is the UHF band and said second frequency band is the VHF band, said first tuner comprising means for developing an intermediate frequency, said frequency suppressing means comprising means for attenuating said intermediate frequency.

12. The receiver of claim 1, in which said first switch means in its said first position is effective to operatively connect the output of said frequency suppressing means to a point of reference potential.

13. The receiver of claim 12, in which said first frequency band is the UHF band and said second frequency band is the VHF band, said first tuner comprising means for developing an intermediate frequency, said frequency suppressing means comprising means for attenuating said intermediate frequency.

14. The receiver of claim 1, in which said first frequency band is the UHF band and said second frequency band is the VHF band, said first tuner comprising means for developing an intermediate frequency, said frequency suppressing means comprising means for attenuating said intermediate frequency.